United States Patent [19]

Sheer et al.

[11] Patent Number: 5,236,779
[45] Date of Patent: Aug. 17, 1993

[54] ARTICLE OF MANUFACTURE

[75] Inventors: M. Lana Sheer, Chadds Ford, Pa.; John C. Solenberger, Wilmington, Del.

[73] Assignee: E. I. Du Pont de Nemours and Company, Wilmington, Del.

[21] Appl. No.: 748,332

[22] Filed: Aug. 21, 1991

Related U.S. Application Data

[63] Continuation-in-part of Ser. No. 433,819, Nov. 9, 1989, abandoned, which is a continuation-in-part of Ser. No. 251,772, Oct. 3, 1988, abandoned.

[51] Int. Cl.$^5$ .............................................. 322B 5/16
[52] U.S. Cl. ................................... 428/323; 206/328; 264/272.11; 428/367; 428/411.1
[58] Field of Search .................... 428/74, 76, 367, 323, 428/411.1; 427/104; 264/272.11, 272.13, 272.15, 272.17; 156/272.6, 272.8; 206/328

[56] References Cited

U.S. PATENT DOCUMENTS

| | | | |
|---|---|---|---|
| 4,542,260 | 9/1985 | Pearce | 174/52 |
| 4,632,798 | 12/1986 | Eickman et al. | 264/272 |
| 4,681,718 | 7/1987 | Oldham | 264/102 |
| 4,844,764 | 7/1989 | Nablo et al. | 156/275.5 |
| 4,861,653 | 8/1989 | Parrish | 428/288 |

OTHER PUBLICATIONS

Helmers Furniture Manufacturing Management, "Decorative Composite Board", pp. 14–17.

*Primary Examiner*—Paul J. Thibodeau
*Assistant Examiner*—R. Follett

[57] ABSTRACT

An encapsulated electrical or electronic device having a first layer of electrically insulating material which is then covered by another layer filled with thermally conductive fibers such as mesophase pitch based carbon fibers. Both layers are of the same base resin.

1 Claim, 2 Drawing Sheets

ARTICLE OF MANUFACTURE

BACKGROUND OF THE INVENTION

This application is a continuation-in-part of copending application Ser. No. 07/433,819 filed Nov. 9, 1989 now abandoned which in turn is a continuation-in-part of application Ser. No. 07/251,772, filed Oct. 3, 1988 now abandoned.

This invention relates to encapsulated electrical and electronic devices and, more particularly, it relates to electrical and electronic devices encapsulated with both an insulating material and a thermally conductive material.

Specific techniques for encapsulating electrical and electronic devices are known as disclosed by Eickman et al. in U.S. Pat. No. 4,632,798. They also disclose that it is common practice to include, within the encapsulating resin, particulate filler material such as silica or alumina which serves to increase the thermal conductivity.

The market segments for electrical devices such as for windings of motors, transformers and solenoids and electronic devices such as microchips are increasingly moving to miniaturization of such devices. This in turn leads to a rise in internal equipment operating temperature resulting in not only a need for higher temperature ratings on insulation materials used for these applications, but also a need for materials with improved thermal conductivity properties to rapidly remove the heat generated.

SUMMARY OF THE INVENTION

In order to complement the move toward miniaturization of such electrical and electronic devices, an article of manufacture has been developed which comprises an electrical device encapsulated with a layer of an electrically insulating material that in turn is encapsulated with a layer of thermal conductive material forming an outer surface of the article. A single phase interface is found between the layers. The thermal conductive material comprises 10 to 70% by weight and preferably from about 15 to about 60% carbon fiber, the balance being made up of a matrix of resin or a combination of a resin and an alternate fiber or filler. The electrically insulating material is made of a matrix resin or a combination of a resin and a reinforcing fiber and/or a filler. It is important that the resins are the same to enable the formation of the single phase interface between the layers such that the layers appear as one at the interface.

Suitable resinous materials which may be used as the resin include, but are not limited to, polyethylene terephthalate, Teflon ® PFA by E. I. du Pont de Nemours and Company (Du Pont), amorphous copolyamides as described in U.S. Pat. No. 4,681,411, and Hytrel ® 7246 by Du Pont as well as thermosetting resins.

The carbon fibers are preferably centrifugally spun from mesophase pitch as disclosed in U.S. Pat. No. 4,861,653 which is incorporated herein by reference.

In general, these fibers have a unique lamellar microstructure and a cross-sectional width of less than about 12 micrometers (microns), usually from about 2 to 12 micrometers. The actual denier of such fibers will depend on the density as well as the size of the particular fiber which may, in highly graphitic structures (density > 2.0 g/cc), numerically exceed 1.0 denier per filament (dpf). The fiber widths are variable and may be measured on an SEM of known magnification. The fiber lengths are variable and preferably exceed about 10 nm in length.

DETAILED DESCRIPTION OF THE ILLUSTRATED EMBODIMENT

Figure 1:
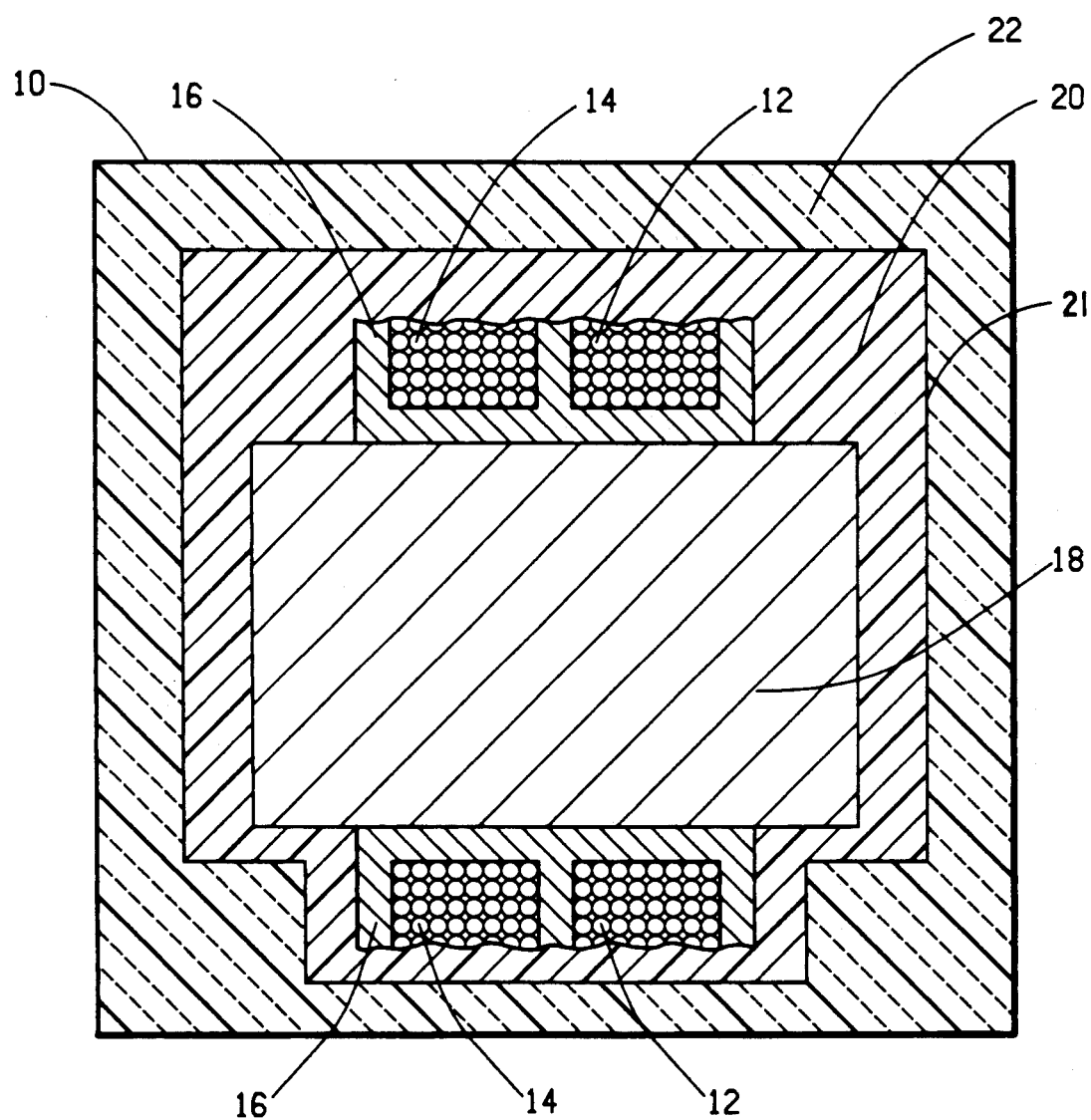
FIG. 1 is a schematic cross-sectional view of a transformer according to the invention.

Referring to FIG. 1, the embodiment chosen for purpose of illustration is an article of manufacture generally designated 10 that includes an electrical device consisting of a plurality of electrically active wire coils 12, 14 wrapped around a coil form 16 positioned on a metal core 18. The coils 12, 14 serve as the primary and secondary windings of a transformer with connections leading to external terminals (not shown). Surrounding the electrical device is an encapsulating first layer 20 of an electrically insulating material which in turn is encapsulated with a thermally conductive second layer 22 which also can serve as a case for the transformer.

The thermally conductive layer 22 exhibits a three dimensional arrangement of fibers within the resin matrix as estimated from shrinkage data in the x, y, and z coordinate axes directions from mold size to the final part. More particularly, essentially equal shrinkage of the final part in the x, y, and z directions indicates three dimensional isotropic fiber reinforcement while shrinkage of the final part that varies by several orders of magnitude between directions suggests highly oriented reinforcing fibers.

Figure 2:
FIG. 2 is a photograph enlarged 200× showing the interface between an electrically insulating material and a thermal conductive encapsulating material.

As best shown in FIG. 2, there is formed a single phase interface 21 between first and second layers 20 and 22 such that the layers appear as one at the interface. This single phase interface 21 is created by using the same base resin in each layer and molding techniques disclosed in the following Example. This, in turn, provides for a rapid heat transfer from layer 20 to layer 22 which could not be obtained with incompatible or dissimilar resins.

EXAMPLE

In step I, a non-encapsulated transformer is introduced into a steel injection molding tool held in a standard injection molding machine. The cavity of the injection molding tool has (1) notches cut into them so as to allow the transformer leads to protrude from the cavity holding the transformer and (2) positioning pins to hold the transformer in place so that the injected polymer can flow completely around the transformer. A commercial grade Du Pont Rynite ® FR-530 NC-10 polymer which is a 30 wt. % chopped glass fiber reinforced flame retarded polyethylene terephthlate polymer is heated to a melt temperature of 280° C. and injected into the closed steel mold containing the transformer. After two minutes, the transformer is removed from the original steel mold. In step II, a second steel mold with similar notches and positioning pins having approximately ¼" to ⅜" larger overall inner dimensions than the first mold replaces the first mold in the injection molding machine. A 50 wt. % pitch carbon mat fiber reinforced flame-retarded polyethylene terephthalate polymer made by compression molding alternate layers of flame retarded polyethylene terephthalate polymer film and carbon fiber bats made according to the disclosure in U.S. Pat. No. 4,861,653 which is subsequently chopped into ¼" pellets and fed to the injection molding machine where it is heated to 280° C. and injected into the tool cavity containing the previously encapsulated transformer of step I. This doubly encapsulated transformer is removed from the mold after 1 minute and 40 seconds. A two shot encapsulated transformer was tested for electrical insulation properties of the inner layer and thermal conductivity properties of the outer layer, according to the Underwriters Laboratories standard UL 1585, sections 28, Rated Secondary Current Test, and 29, Rated Output Heating Test, and the temperature rise of 42° C. was much less than the specified maximum temperature specified in the UL 1585 standard. The integrity of the electrical insulation was maintained.

What is claimed is:

1. An improved article of manufacture comprising an electrical device having electrically active components, said components being encapsulated with a first layer 20 of an electrically insulating resin and a second layer 22 of a thermally conductive material forming the outer surface of said article, said second layer comprising an electrically insulating resin of the same composition as the first electrically insulating resin reinforced with a three dimensional arrangement of carbon fibers, said carbon fibers having a lamellar microstructure, a distribution of widths of from about 2 to about 12 micrometers and lengths above about 10 mm, there being a single phase interface formed between said first and second layer such that the layers appear as one at the interface.

* * * * *